United States Patent
Bruggeman

[19]

[11] Patent Number: 6,054,710
[45] Date of Patent: Apr. 25, 2000

[54] METHOD AND APPARATUS FOR OBTAINING TWO- OR THREE-DIMENSIONAL INFORMATION FROM SCANNING ELECTRON MICROSCOPY

[75] Inventor: Albert C. Bruggeman, Fremont, Calif.

[73] Assignee: Cypress Semiconductor Corp., San Jose, Calif.

[21] Appl. No.: 08/993,036

[22] Filed: Dec. 18, 1997

[51] Int. Cl.$^7$ .................................................. G01N 23/225
[52] U.S. Cl. ..................... 250/307; 250/252.1 R
[58] Field of Search .............................. 250/307, 252.1 R

[56] References Cited

U.S. PATENT DOCUMENTS

| | | | |
|---|---|---|---|
| 4,733,074 | 3/1988 | Kato et al. | 250/307 |
| 5,050,095 | 9/1991 | Samad | 364/513 |
| 5,060,278 | 10/1991 | Fukumizu | 382/14 |
| 5,073,867 | 12/1991 | Murphy et al. | 395/27 |
| 5,159,660 | 10/1992 | Lu et al. | 395/23 |
| 5,222,194 | 6/1993 | Nishimura | 395/23 |
| 5,239,594 | 8/1993 | Yoda | 382/15 |
| 5,247,584 | 9/1993 | Krogmann | 382/14 |
| 5,265,224 | 11/1993 | Maruno | 395/24 |
| 5,311,600 | 5/1994 | Aghajan et al. | 382/14 |
| 5,396,580 | 3/1995 | Fu | 395/22 |
| 5,408,588 | 4/1995 | Ulug | 395/23 |
| 5,479,570 | 12/1995 | Imagawa et al. | 395/20 |
| 5,479,576 | 12/1995 | Watanabe et al. | 395/23 |
| 5,500,905 | 3/1996 | Martin et al. | 382/157 |
| 5,522,015 | 5/1996 | Watanabe | 395/23 |
| 5,574,827 | 11/1996 | Wang | 395/24 |
| 5,598,508 | 1/1997 | Goldman | 395/22 |
| 5,598,509 | 1/1997 | Takahashi et al. | 395/22 |
| 5,602,938 | 2/1997 | Akiyama et al. | 382/155 |
| 5,621,861 | 4/1997 | Hayashi et al. | 395/23 |
| 5,804,460 | 9/1998 | Bindell et al. | 250/251.1 |

FOREIGN PATENT DOCUMENTS

| | | |
|---|---|---|
| 0 360 674 | 3/1990 | European Pat. Off. . |
| WO 87/07053 | 11/1987 | WIPO . |
| WO 90/15390 | 12/1990 | WIPO . |
| WO 90/16038 | 12/1990 | WIPO . |

OTHER PUBLICATIONS

"Characterization of Aluminum Hydroxide Particles from the Bayer Process Using Neural Network and Bayesian Classifiers", Zaknich, IEEE Transactions on Neural Networks, vol. 8, No. 4, Jul. 1997, pp. 919–931.

"Iron Silicide Formation on Hydrogenated Amorphous Silicon", Grunow et al., Thin Solid Films Journal, vol. 275, Nos. 1–2, pp. 191–194.

"Reactive Ion Etching Profile and Depth Characterization Using Statistical and Neural Network Analysis of Light Scattering Data", Krukar, et al., J. Appl. Phys. 74(6), Sep. 15, 1993, pp. 3698–3706.

"On Hidden Nodes for Neural Nets", Mirchandani, IEEE Transactions on Circuits and Systems, vol. 36, No. 5, May 1989, pp. 661–664.

"Edge Detection for Optical Image Metrology Using Unsupervised Neural Network Learning", Aghajan et al., IEEE, pp. 188–197.

*Primary Examiner*—Jack Berman
*Attorney, Agent, or Firm*—Christopher P. Maiorana, P.C.

[57] ABSTRACT

A system for determining one or more critical dimension(s) of a semiconductor structure comprising a scanning electron microscope and a parallel distributed process operationally connected to an output of a scanning electron microscope. Said parallel distributed process containing coefficients that provide a multi dimensional mapping space for the output of said scanning electron microscope to map to an output value that provides information on the dimensions of the semiconductor structure.

11 Claims, 7 Drawing Sheets

METHOD AND APPARATUS FOR OBTAINING TWO- OR THREE-DIMENSIONAL INFORMATION FROM SCANNING ELECTRON MICROSCOPY

FIELD OF INVENTION

The present invention relates to semiconductor manufacturing and testing. More specifically, the present invention relates to methods and apparatus for improving a scanning electron microscope's ability to determine critical dimensions of semiconductor structures.

BACKGROUND

High performance semiconductor manufacturing is largely a heuristic effort involving much trial and error. Thus, acquiring the know how to consistently achieve high semiconductor yields is largely labor intensive. A crucial part of this experience gathering is the timely receipt of accurate feedback on how minute semiconductor structures are formed on the semiconductor substrate. With timely and accurate feedback, the process engineer's optimization efforts can more effectively increase semiconductor yields. While all semiconductor manufacturers have their own recipe for success, all semiconductor manufacturers can benefit from the present invention's improvements.

Conventional instruments for measuring semiconductor structures include the following three types: (1) scanning electron microscopes, (2) atomic force microscopes, and (3) electrical test structures.

The scanning electron microscope (SEM) is an important instrument by which semiconductor manufacturers receive timely and somewhat accurate information of the semiconductor structures they are fabricating. The SEM provides means for observing and garnering some information on the physical dimensions of minute semiconductor structures.

The scanning electron microscope functions by directing a narrow beam of electrons at an observation target and measuring the electron beam's return signal with a detector. While the intricate details of how a SEM functions is beyond the scope necessary for the present discussion, the limitations of the SEM are illustrative of the need for the present invention.

Two major sources of error in the SEM output waveform include (1) secondary electron emissions and (2) "modulation" of the electron beam. The secondary electron emission problem arises in part from the excitation of the structure being irradiated with the electron beam and the structures surrounding the device under test (DUT). Secondary electron emissions, inter alia, may inject non-linear noise into the measurement system.

Modulation of the SEM electron beam may be a second factor in distorting the SEM measurement. Modulation of the electron beam may result from several different factors including electrical charge(s) accumulating in or on the DUT, the finite width (or limited resolution) of the scanning electron beam; limitations and non-linear response in and from the SEM detector; and limitations to the models used to extrapolate information from the SEM output waveform about the structure under inspection.

As device design rules continue to shrink the semiconductor structures, these limitations of the SEM for process inspections become more glaring.

Figure 1:
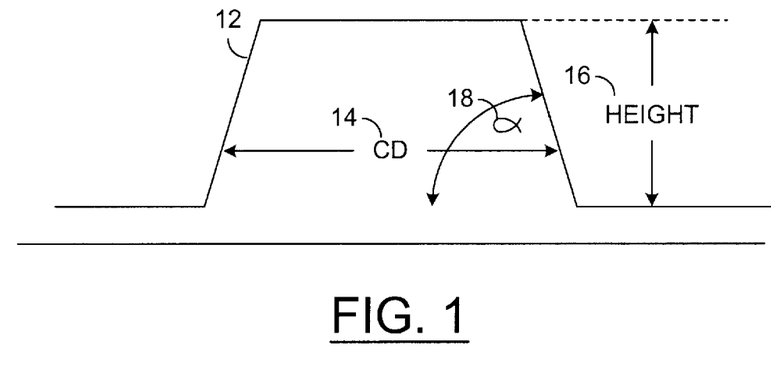
FIG. 1 depicts a side view of a semiconductor structure under test.

As applied in practice, the limitations of the SEM make it difficult to accurately determine so called "critical dimensions" of the structure under inspection. A "critical dimension" may be defined as the physical dimensions of a semiconductor structure that fall within predetermined parameters. For example, FIG. 1 provides an illustration of a structure under inspection by SEM. The structure 12 has a width 14, a height 16 an angle denoting the ratio 18 of the width to the height of the structure (denoted by the term "alpha" or α). These three measurements may indicate one or more critical dimensions of the structure. The SEM, however, cannot readily detect the height and alpha of the semiconductor structure because of the distortion on the SEM output.

Figure 2:
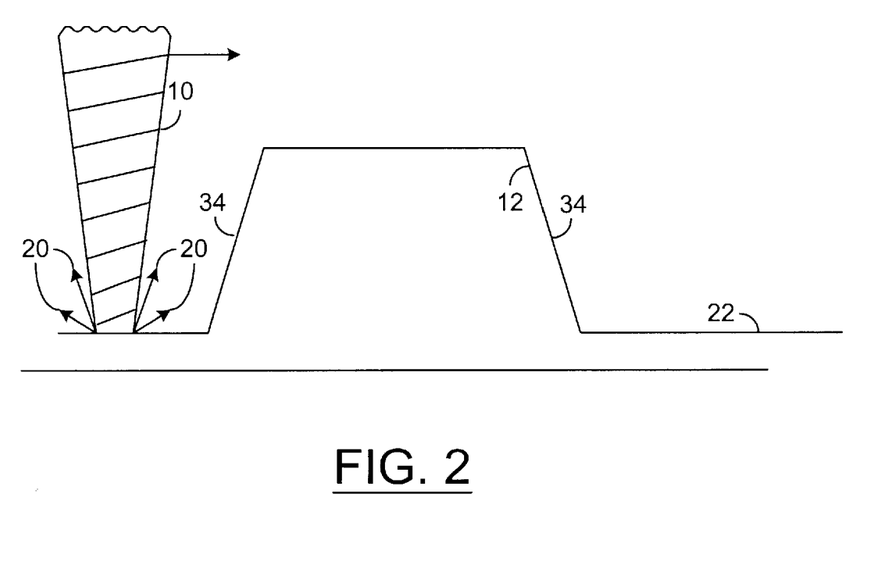
FIG. 2 depicts scanning electron microscopy of the semiconductor structure of FIG. 1 under test, showing secondary emission.

In FIG. 2, the electron beam 10 from the SEM is shown approaching the structure under inspection 12 from the left. FIG. 2 shows the secondary emission 20 and beam scattering effect induced into the beam from the device under test 22.

Figure 3:
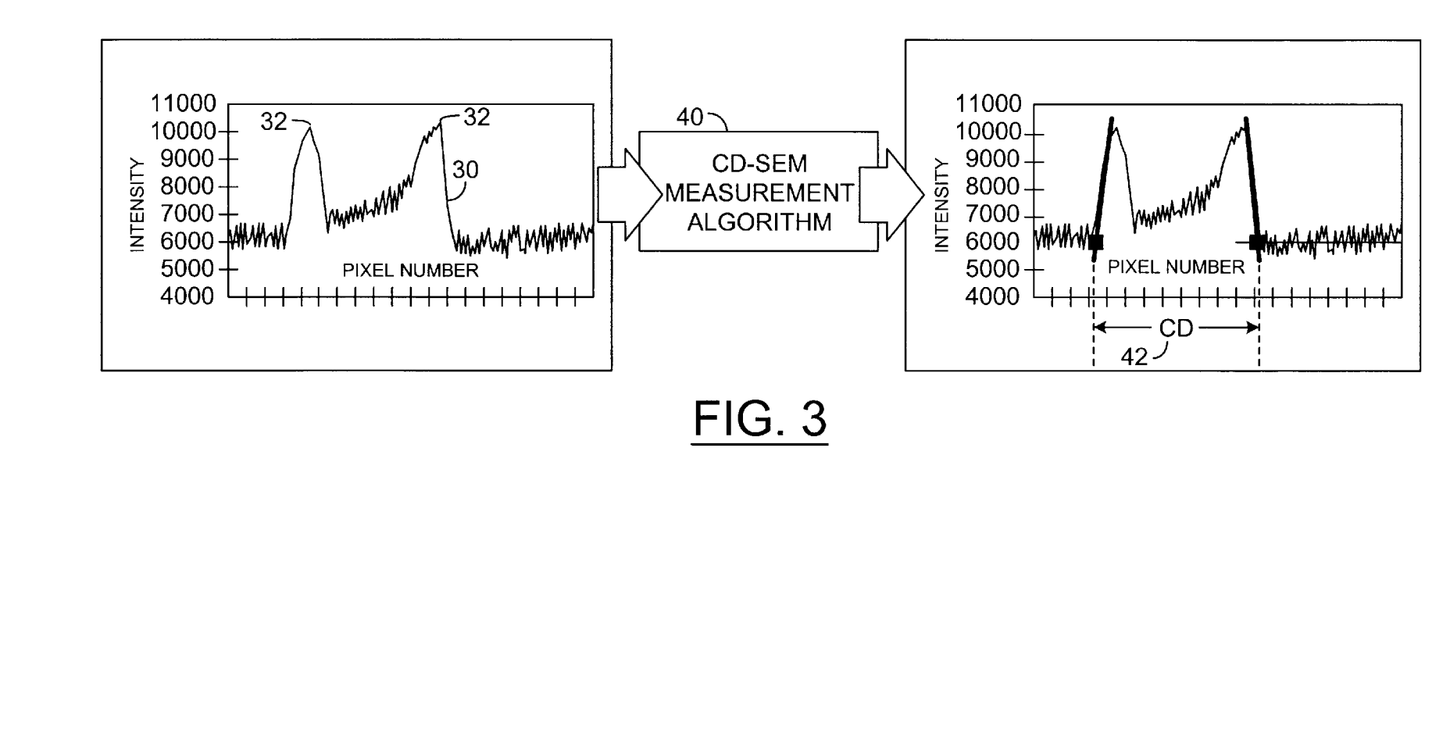
FIG. 3 depicts a typical output waveform of the structure under test from a scanning electron microscope a conventional CD-SEM algorithm applied to the scanning electron microscope output waveform and the critical dimension calculated by the CD-SEM algorithm superimposed on the scanning electron microscope waveform.

Additional distortion on the beam may be induced by electron absorption, e.g., electrical charging of the device under test. FIG. 3 shows an output waveform 30 of the SEM for the device under test and the structure under inspection. The waveform peaks 32 shown in FIG. 3 may give an indication of the relative distance of the edges 34 shown in FIG. 2 of the structure under test. The SEM output waveform may be input to a critical dimension-scanning electron microscope (CD-SEM) algorithm 40 to help determine an estimate of the critical dimension of the structure under test 42. This CD-SEM algorithm, shown in FIG. 3 as box 40, may approximate a critical dimension by determining the "distance" 42 between the algorithm-determined points on the SEM waveform 30.

The major short coming of this methodology is that the critical dimension is determined from the two dimensional width of the structure under test. Thus, the SEM does not use the height, slope and other three dimensional characteristics of the structure under test to determine critical dimensions.

The atomic force microscope (AFM) may also be used to measure semiconductor structures. The atomic force microscope measures the so called atomic force between the probe of the AFM and the structure under test. The so called atomic force is a force that acts between atoms when the atoms are in extremely close proximity. The AFM makes practical use of the atomic force phenomena by placing the AFM probe in very close proximity to the structure under test and slowly moving the probe across the structure under test. By using the atomic force to keep the AFM probe a predetermined (and extremely close) distance from the structure under test in conjunction with a means for precisely determining the probe location, the AFM may measure the physical dimensions of the structure under test much more accurately than the SEM. However, atomic force microscopy is a very slow and expensive process that limits its usefulness in providing timely and cost-effective feedback to the semiconductor manufacturer.

SUMMARY OF THE INVENTION

The present invention provides a means for determining critical dimension(s) of a semiconductor structure through an improved methodology for processing the SEM output waveform. More specifically, the present invention uses non-linear processing techniques and/or parallel distributed processing techniques to map the SEM output waveform and determine three dimensional characteristics of the structure under test. The result provided by the present invention are generally more accurate than those provided by conventional CD-SEM measurements. In one embodiment, the present invention may employ as a reference structure an identically prepared structure, the characteristics or measurements of which were determined by atomic force measurement.

Thus, the present invention, inter alia, combines the speed of the SEM with the accuracy of the AFM to provide timely and accurate feedback to the semiconductor manufacturing process.

This may be accomplished through the use of an artificial neural network that contains the "weights" and/or the co-efficients of a set of non-linear neural network equations useful and/or sufficient to map an SEM output waveform (the neural network input) through a multi-dimensional decision space defined by corresponding waveforms from an identically-prepared structure measured by atomic force microscopy.

As noted above, AFM is much more accurate than SEM alone at determining the actual dimensions, and as important for semiconductor processing, the critical dimension(s) of semiconductor structure under test. AFM, however, is considerably slower than the SEM at "scanning" a structure and may result in the destruction of the device under test. The destruction of the device under test may be required because AFM may function on the edge of the structure under test. To produce an appropriate "edge," the device under test may be cut and/or precisely split to provide an "edge" view in which to measure the atomic force of the structure under test. The AFM may also function in a non-destructive mode and without splitting or cutting the DUT.

The atomic force measurement device characterizes and/or measures the structure under test to provide an accurate cross-sectional and/or three dimensional representation of the structure under test. By correlating the physical coordinates of the AFM measurement with a corresponding SEM measurement, data can be collected which provides a one-to-one correspondence between a particular SEM output waveform and a particular AFM output and/or measurement for an identically prepared structure under test. By repeating the SEM and AFM measurement for different locations on the semiconductor and for different structures on the semiconductor and optionally for a plurality of semiconductors, a data set and/or an array of data pairs can be assembled of SEM output waveforms and AFM output measurements.

The present invention may use non-linear processing techniques to process the SEM output waveform to select a critical dimension for the structure under test. The non-linear techniques may use "hidden" characteristics of the SEM output waveform to organize and/or define a multi-dimensional decision space to determine the critical dimension for a structure under test. This technique provides a three dimensional determination of the critical dimension. One exemplary non-linear processing technique that may be utilized by the present invention is an artificial neural network.

One particular non-linear processing technique that may find applicability in the present invention is the back-propagation neural network. A back-propagation neural network may be utilized by the present invention to "learn" the mapping from the SEM output waveform to an AFM output waveform, from which the critical dimension can be determined with greater accuracy than the CD-SEM methodology. Neural network techniques as described and provided in Romelhart and McClelland's text "Parallel Distributed Processing: Explorations in the Microstructure of Cognition: Foundations," MIT Press, 1986, ISBN 0262181207, the relevant portions of which are incorporated herein by reference, may create a multidimensional decision space through which a non-linear function can map an input waveform to an output waveform. Several neural network paradigms may be utilized such as associative learning and back propagation and are within the scope of the present invention. Of these neural network paradigms, the feed-forward back propagation methodology is preferred for the present invention.

A back-propagation neural network is a network that may be trained with an appropriate data set. The network learns the transfer function and/or mapping by using the mathematical derivative of the neural network transfer function to produce a gradient that "slopes" or points in the direction of coefficients that will minimize the error between the actual network output and the desired output. The "weights" or network equations coefficients may then be adjusted to move the actual network output towards the desired output, e.g., by following the gradient. This is sometimes called "gradient descent" learning. Thus, the network input is propagated forward (feed-forward) and the error function of the gradient descent methodology may propagate backwards through the network. By slowly and by iteration following the gradient, the network may eventually settle on an "optimal" or global solution for the mapping function.

The configuration for a single "hidden" layer neural network suitable for an example configuration of the present invention may be determined with $\log_2 M$ calculation as provided by Mirchandani and CAD in "On Hidden Nodes for Neural Nets," IEEE Transactions on Circuits and Systems, Vol. 36, No. 5, May 1989, the relevant portions of which are incorporated herein by reference.

DETAILED DESCRIPTION OF THE INVENTION

Figure 4:
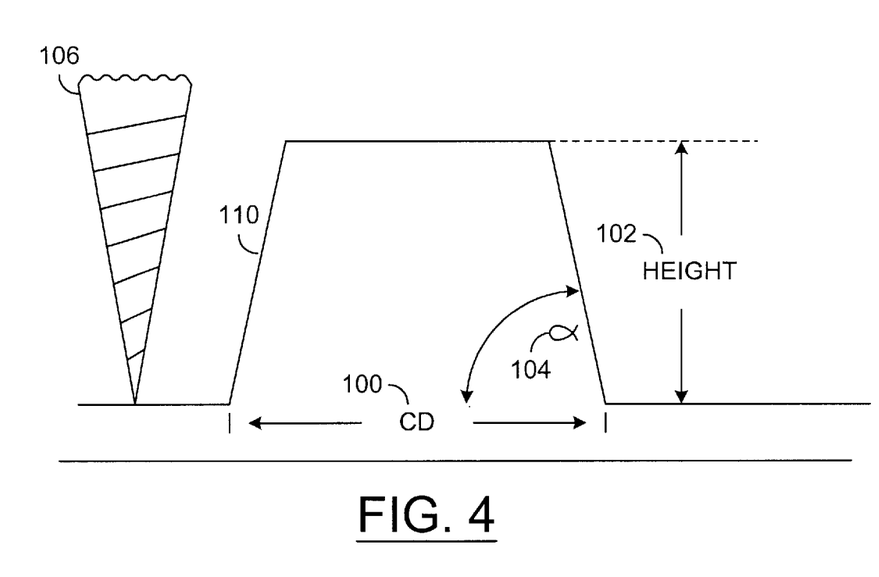
FIGS. 4 and 4a depicts a side view of a semiconductor structure under test.
Figure 4A:
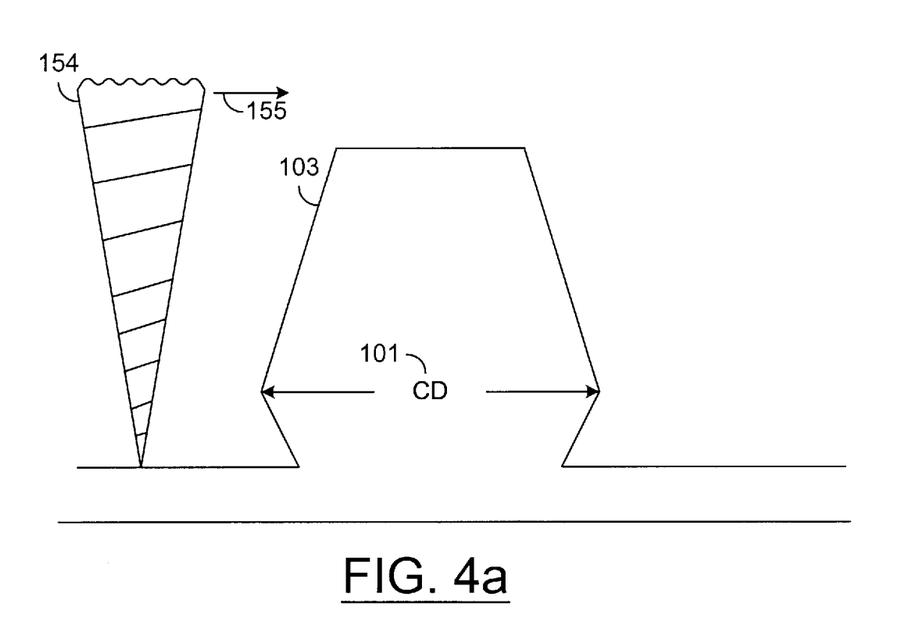

FIG. 4 depicts a cross sectional view of a structure under test and a semiconductor wafer. The structure has a critical dimension (CD) denoted as the width 100 of the structure under test. The so called critical dimension is a factor which may identify or define the minimum physical dimension for a semiconductor structure to ensure acceptable reliability, which among other things, is used to determine the performance of the fabrication process. For example, FIG. 4A depicts a structure under test 103 wherein the maximum width of the semiconductor structure 101 is located above the underlying semiconductor substrate material. The so called critical dimension, here, may actually be the cross sectional area of the semiconductor structure. The present invention, because it may characterize the structure under test in three dimensions, may provide the process engineer with the three dimensional representation of the structure shown in FIG. 4A. In contrast, the SEM electron beam may be blocked by the skirts below the maximum width points 101, thereby providing an erroneous indication of the cross sectional area and hence, the critical dimension. Through the use of the three dimensional representation of the structure under test, a multidimensional "critical dimension" of the semiconductor structure may be accurately determined. This characterization may in turn be used to determine whether the structure under test is within acceptable limits and/or may be used to predict device performance. FIG. 4 and 4A depict an electron beam from the scanning electron microscope at 106 and 154 respectively. For this discussion, the electron beam scans from left to right 155 over the structure under test 110.

Figure 5:
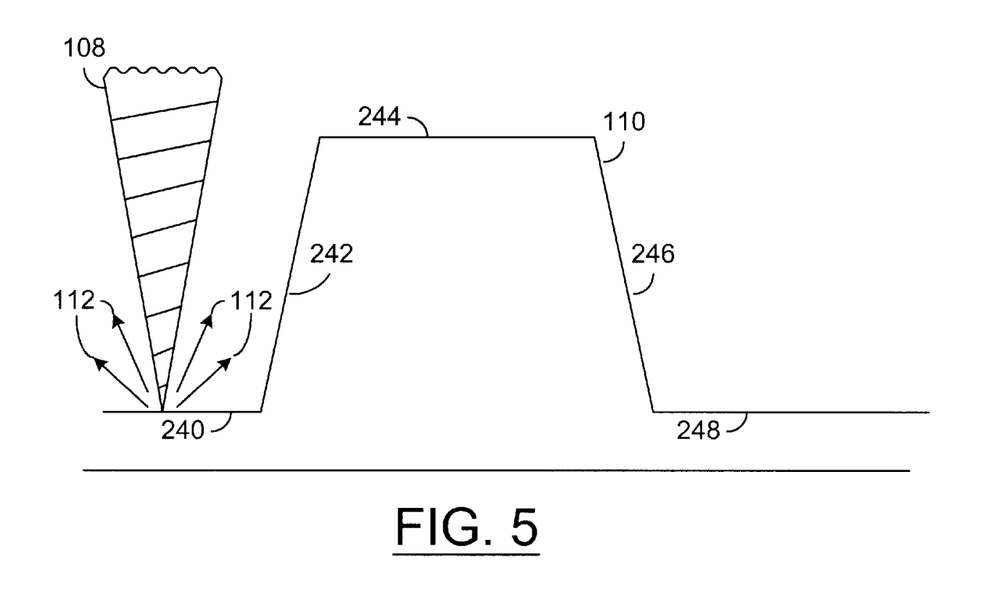
FIG. 5 depicts the electron beam from a scanning electron microscope and secondary emissions.

FIG. 5 depicts the electron beam 108 from the scanning electron microscope, the structure under test 110 and secondary electron emissions 112. As noted above, secondary electron emissions, electrical charging of the device under test (e.g., electron absorption), and other beam modulation factors may distort the resolution of the measurement of the structure under test 110.

Figure 6:
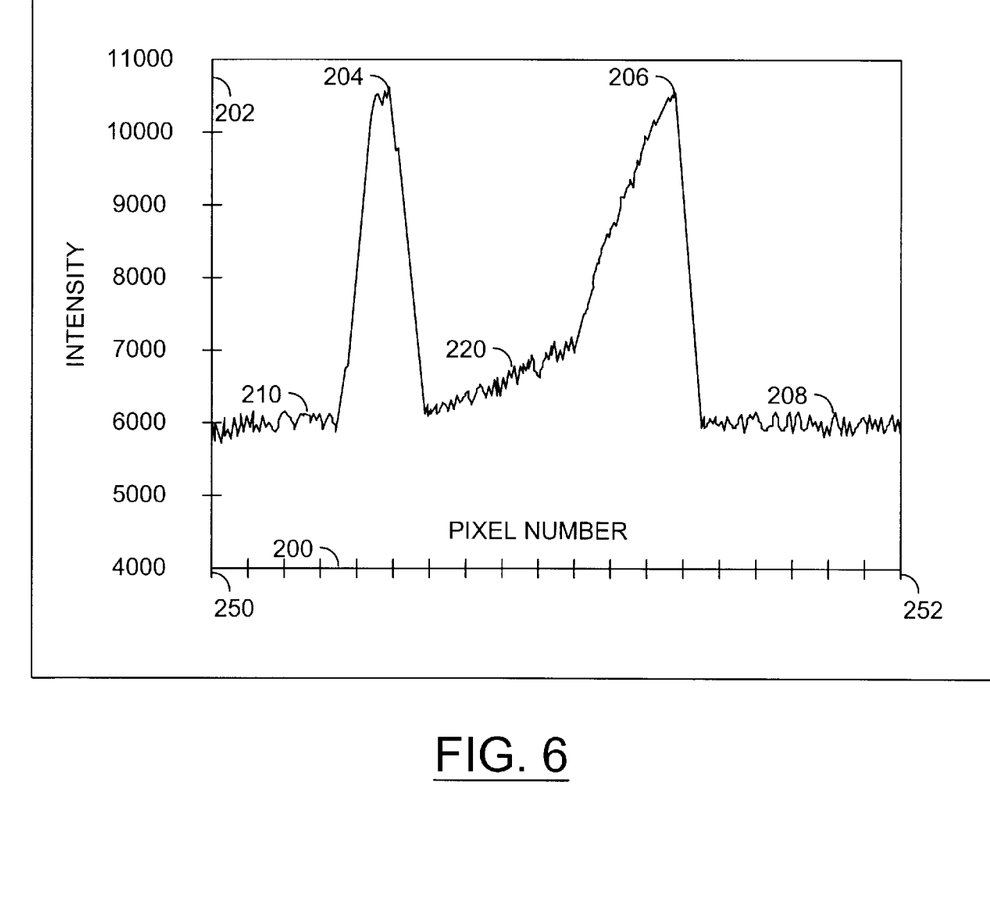
FIG. 6 depicts the output waveform from the scanning electron microscope applied to the input of a feed forward back propagation neural network and the post network processing stage.

FIG. 6 depicts a possible SEM output waveform for the structure under test 110. The output waveform is depicted as part of the SEM scan and/or a window on the part of the signal of interest. The horizontal axis 200 may be indexed as a pixel number with a pre-determined resolution. The pixel and/or sampling resolution may be determined by the Nyquist sampling formula in that the sampling rate or the resolution must be at least double the highest frequency, and/or frequency component of a complex waveform, that is of interest to the process. The vertical axis 202 may be denoted as the intensity of the output waveform. The SEM output waveform may correspond to the characteristics of the structure under test as the left most relatively low intensity output 210 denoting the semiconductor region to the left 240 of the structure under test. The left intensity peak 204 may denote the left side of the structure under test 242. The waveform "valley" 220 may denote the plateau 244 of the structure under test. The right intensity peak 206 may correspond with the right side 246 of the structure under test. The low intensity level 208 may correspond to the semiconductor substrate 248 to the right of the structure under test. The SEM output waveform may contain information that indicates the height and slope of side walls of the structure under test. However, this information may be "hidden" in noise and/or the non-linear aspects of the waveform. A sampling "window", e.g., the selection of the waveform data and end points 250 and 252, may be determined by the predetermined size of an idealized structure under test.

Figure 7:
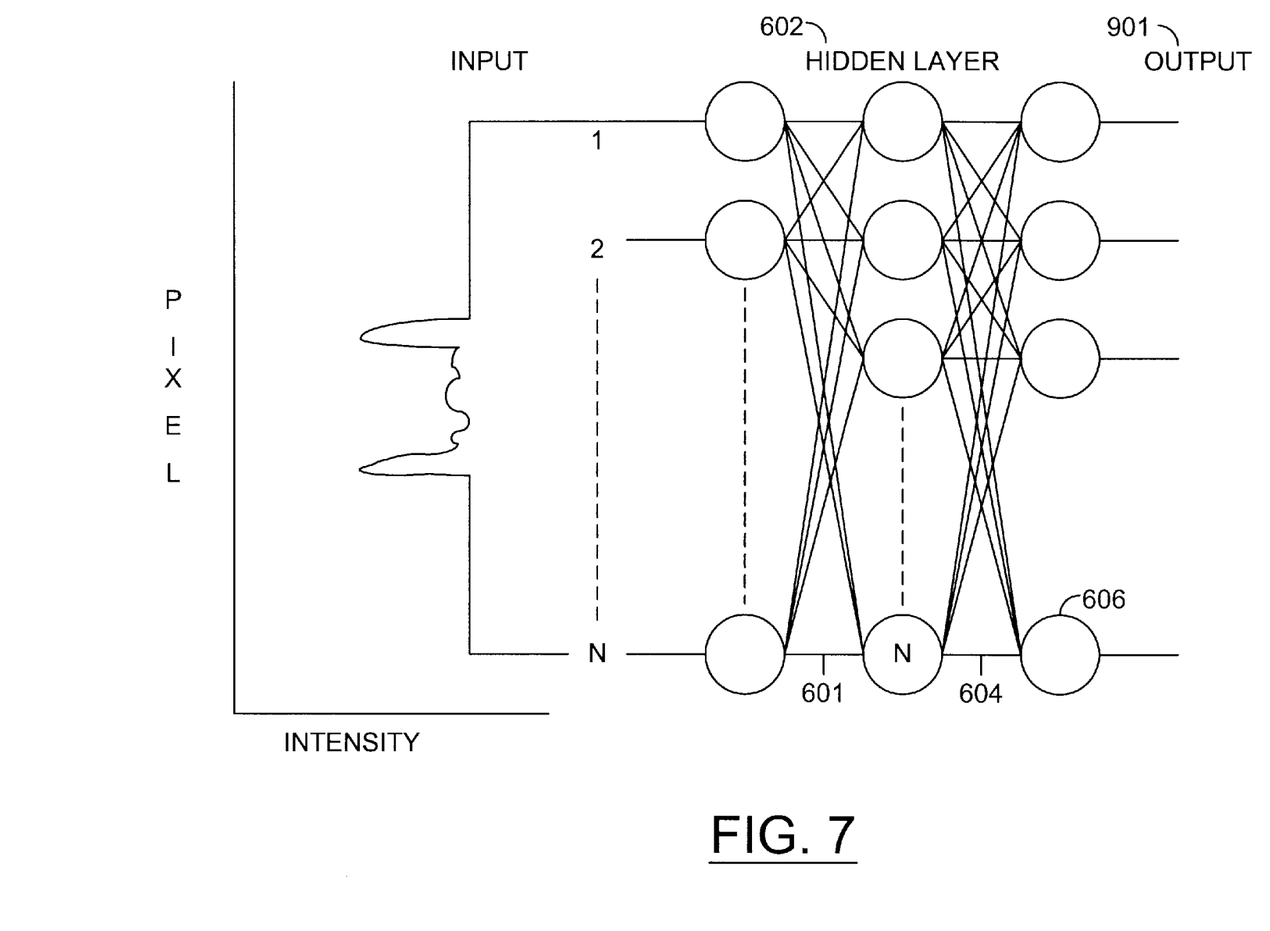
FIG. 7 depicts a neural network used to map the scanning electron output waveform to a corresponding physical approximation of the structure under test.

FIG. 7 depicts a neural network configuration that maps the SEM output waveform to the physical characterization of the structure under test as determined by the atomic force microscope. The training and configuration for this neural network is discussed further below.

The back-propagation neural network paradigm uses supervised training to "learn" the desired mapping task. The supervised training paradigm may require an appropriate set of data (or data training set) in which the network can "learn" the desired function. An appropriate data training set for the present invention may be collected by acquiring SEM output waveforms of structures under test and a corresponding measurement of the structure under test with an atomic force microscope.

Figure 8:
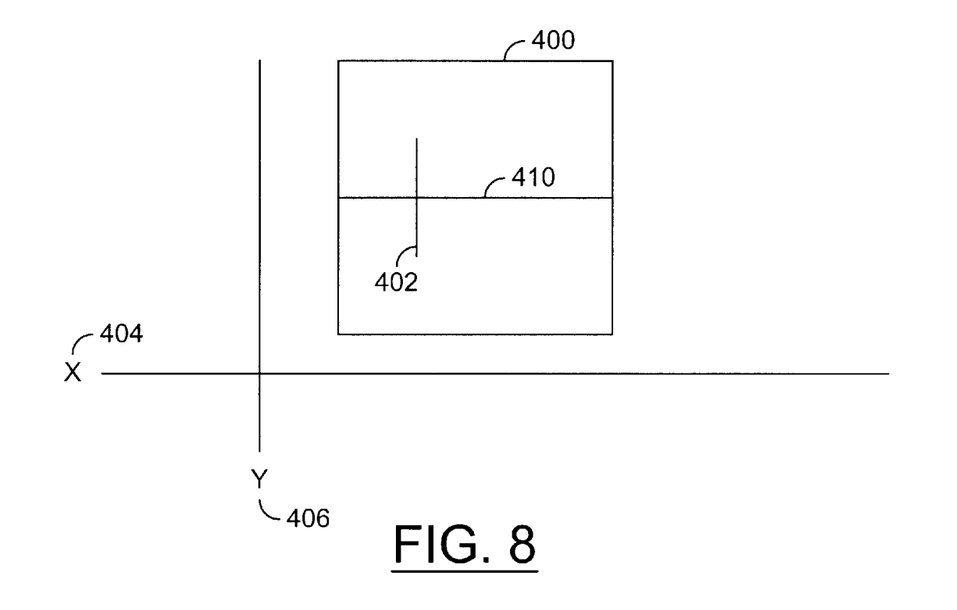
FIG. 8 depicts an output waveform from an atomic force microscope.

In general, the SEM provides an output that is associated with a calibrated and precise location of the SEM probe. Thus, once a structure under test is selected, for example, structure 402 on FIG. 8, the SEM probe location and SEM output waveform yield precision measurements of the physical location of the structure under test 402 with respect to the device under test 400. Therefore, the intensity output from the SEM is correlated with precise two-dimensional locational measurements of the structure under test. As shown in FIG. 8, the location of the SEM probe essentially yields measurements in precise X 404 and Y 406 coordinates.

Figure 9:
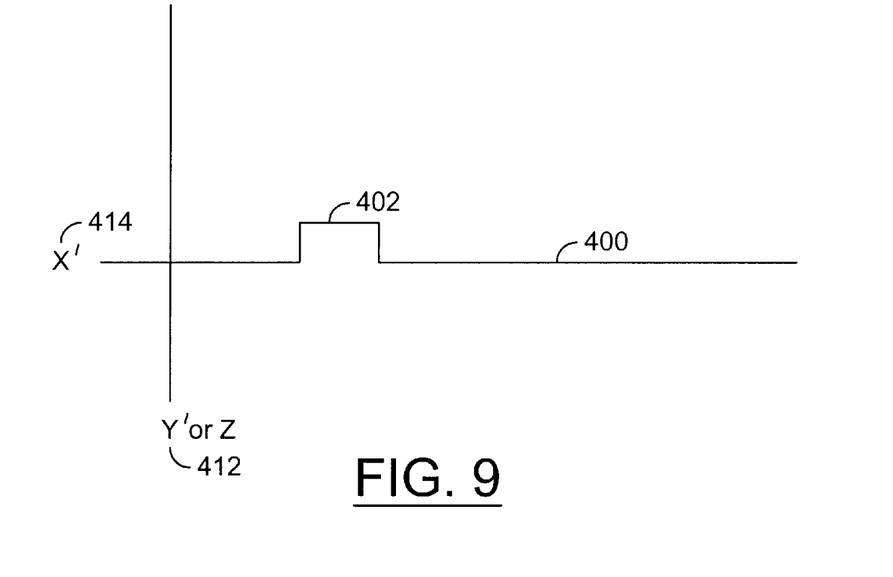
FIG. 9 depicts the detailed configuration of the neural network post processing stage.

The atomic force microscope also provides a precision output of the atomic force probe coordinates. The AFM measurement, however, is in a different coordinate frame of reference (e.g., one dimension) than the SEM. For example, in FIG. 8, line 410 may indicate the line through which the device under test 400 may be characterized. FIG. 9 may then represent a cross sectional view of the device under test along line 410. The AFM may take precision atomic force measurements and provide a precision output of the AFM probe location in an X'414 and Y'412 coordinate system. The X 404 and X'414 coordinates may be adjusted, that is X=(X'-A), where A is an adjustment factor to correlate the X and X' coordinate frames of reference. The Y 406 coordinate from the SEM may be adjusted to the AFM frame of reference because the device under test 400 may be probed along line 410 which reflects a Y 406 SEM coordinate position. The AFM introduces a "new" axis which may be denoted as Z or Y'412. With respect to the AFM instrumentality, however, the atomic force probe precision coordinates may be actualized as an X' and Y' coordinate frame of reference. Here, however, because the AFM device measures along a cross section of the device under test the Y' coordinate with respect to the SEM coordinate system is a third and/or Z axis. Thus, the present invention may translate and/or map the two-dimensional SEM output to a three-dimensional characterization of the structure under test. Notably, this mapping may associate and/or correlate hidden relationships between the complex SEM waveform and subtle physical characteristics of the structure under test as determined by the AFM. For example, the relationship between the slope and height of the structure under test may be hidden in the SEM output waveform. Table 1 may provide a graphical representation of a representative data set suitable for training the back propagation neural network utilized in one mode of the present invention.

TABLE 1

| SEM WAVEFORM | AFM OUTPUT |
| --- | --- |

The representative training data set may be normalized for use with the neural network input. The normalization procedure that may be used in one configuration of the present invention is calculating the weighted average of the data input. The weighted average of the data input may be determined by calculating the average value of the data and then dividing each data input point by the average value.

In a similar manner, because the atomic force measurement is also a measurement, the data may require normalization before it may be used with the data set. The AFM output may also be normalized with the weighted average method. That is, the average intensity of the AFM output may be used to divide the individual intensity output. This may provide normalized data for the training set.

Figure 10:
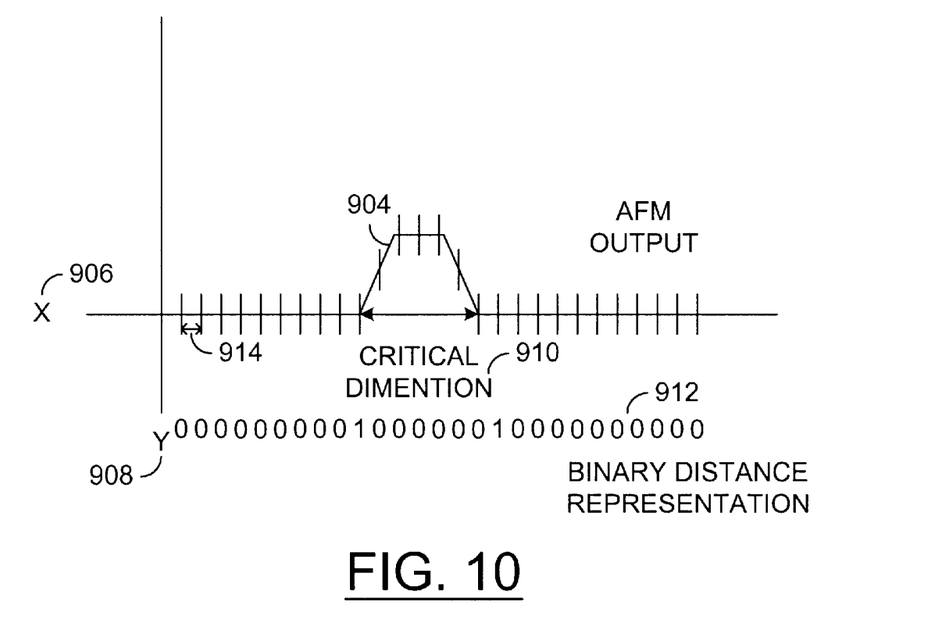
FIG. 10 depicts a binary distance coding of the atomic force microscope output.

A second configuration of the present invention may artificially calibrate the neural network output 901 so that a physical distance or a predetermined critical dimension is encoded in a binary distance. In this configuration the critical dimension based on measurements may be determined by AFM. This critical dimension may then be represented in binary form. For example, FIG. 10 may represent the AFM output 904 in a calibrated frame of reference X 906 and Y 908. The critical dimension 901 may be measured directly from the AFM output 904. The critical dimension may be encoded in a binary format 912 with each digit representing a predetermined distance 914. Collection of data for a data set to train the neural network may be gathered as previously described with the added step of binary distance coding the AFM information. The binary distance information may not require normalization.

Once a data set that pairs an SEM output with an AFM measurement of the structure under test is collected and normalized, neural network training may begin.

As described above, the back-propagation network may be trained with the gradient descent technique. Permutations on the gradient descent technique such as the addition of a momentum factor are known to those skilled in the parallel distributed processing art and are within the scope of the present invention. Likewise, techniques other than gradient descent are training methodologies known to those skilled in the parallel distributed processing art and are within the scope of the present invention. In the present best known configuration, the gradient descent learning method is used without a momentum factor.

The gradient descent learning methodology begins by initializing the artificial neural network with random co-efficient variables. The random initialization of the network establishes an initial non-symmetrical mapping. The training data set may also be randomized as to the order that input/output pairs are presented to the network. The first input may be applied to the network and the output from the first layer 601 may be determined. The output from the first layer may fan out through the connections between the first and the second layer 602. The connections between the first layer and the second layer may attenuate the signal by the value of the connection weight. The input to the second layer, the "hidden layer", neurons may be calculated by determining the sum of the inputs for each neuron in the second layer. Once the sum of the inputs for each hidden layer neuron is calculated the output of each neuron in the hidden layer may be determined. The output from the hidden layer neurons may be applied to the connections between the hidden layer and the third layer or output layer 604. The connections between the hidden layer and the output layer may attenuate the signal from the output layer by the value of the connection weight. The properly attenuated output from the hidden layer may be used as the input to the third or output layer 606. The sum of the inputs to each neuron in the output layer may then be determined. The sum of the input for each output layer neuron may be applied to an internal neural threshold function. The neural network threshold function may be any continuous non-linear function. The most commonly used functions are the sigmoid and the hyperbolic tangent. The threshold function used, here, is the Sigmoid function $$Y = \frac{1}{1-e^x};$$

where e is the natural logarithmic function. The sigmoid function is used because the input and output waveforms are positive values.

The neural network output 901 is compared to the value of the desired output which, during the training mode, is the value from the output pair in the training data set. The derivative of the neural network transfer function is taken which (because the neural network is a multidimensional equation) provides a multidimensional gradient whose multidimensional surface slopes toward a value which minimizes the difference between the desired output and the actual network output. Changes may then be made to the neural network weights, which may move or adjust the neural network transfer function towards a value minimizing the output error. This gradient descent technique is repeated for the connections between the hidden layer and the input layer neurons, thus providing a means for changing the neural network weights in a direction that minimizes the output error. The neural network is trained repetitively with all the data in the data training set until the network reaches a global minima. Conventional techniques, such as momentum factors and annealization, may be used to prevent the network from converging on a local minimum.

Once the neural network is trained the network configuration and the network weights may be stored on a storage device. In practice, the present invention may use different network configurations, input resolutions and network weights for deployment in different environments. In the best mode of the invention, the present invention may be deployed with a predetermined set of trained networks and network configurations that solve common operational deployments. The end user, usually a process engineer, may then select a pretrained network and further train the network to the particular deployment. The trained neural network is now ready for operational deployment. In operation, the network may execute on any computer processor system. The computer process may be a general purpose computer or a dedicated application specific processor.

In operation, when a "new" SEM waveform is input to the network, the present invention may propagate the input through the network, and via the multi dimensional decision space defined by the network weights, map the input to a three-dimensional characterization, or the "best fit" three-dimensional characterization of the structure under test.

Post Processing Procedures

Suitable post-processing techniques may be used to enhance the present invention's ability to determine the critical dimension of the structure under test. For example, a genetic algorithm may be used to select an appropriate risk/return ratio in determining the critical dimension. In the present invention, the problem solution is a neural network with a particular set of weights. A genetic algorithm selects the best solution from a collection of problem solutions and applies reproduction, cross-over and mutation to generate a new population of problem solutions. Reproduction takes the best solutions and considers them as "parents" to generate "children;" crossover mixes attributes of the parents and mutation introduces attributes that may not yet be represented. The new collection of solutions is cycled through the selection of the "survival of the fittest" process.

Poorer solutions are gradually weeded out until a solution meets a predetermined criteria. Thus, a genetic algorithm may be used to find a neural network solution that optimize user defined performance objectives and meets user defined constraints or risk limits. Like, the neural network methodology the post-processing techniques may execute on a general purpose computer or on an application specific processor.

Having made the above disclosure, these and other modifications are within the spirit and scope of the present invention.

Therefore, I claim:

1. A system for determining one or more critical dimension(s) of a semiconductor structure comprising:
   a scanning electron microscope;
   a parallel distributed process operationally connected to an output of the scanning electron microscope, said parallel distributed process containing coefficients that provide a multi dimensional mapping space for the output of said scanning electron microscope to map to an output value that provides information on the critical dimension of the semiconductor structure.

2. The system of claim 1 wherein said parallel distributed process comprises a feed-forward artificial neural network.

3. The system of claim 1 wherein said coefficients that provide said multidimensional mapping space are determined by measuring dimensions of a similar or identically prepared semiconductor structure with an atomic force microscope.

4. The system of claim 1 wherein said coefficients are on a storage device.

5. A method for determining the three dimensional characteristics of a semiconductor structure from a two dimensional waveform, comprising the steps of:
   providing a two dimensional waveform of a semiconductor structure from a first measurement instrument;
   mapping said two dimensional waveform through a multi-dimensional decision space to a corresponding three dimensional characteristic.

6. The system of claim 1, wherein said critical dimension (s) is/are multidimensional.

7. The method of claim 5 comprising the further step of:
   providing a network configuration and network weights to define said multidimensional decision space.

8. The method of claim 5 comprising the further step of:
   determining said corresponding three dimensional characteristics from a second measurement instrument.

9. The method of claim 5 wherein said first measurement instrument is a scanning electron microscope.

10. The method of claim 8 wherein said second measurement instrument is an atomic force microscope.

11. A method for determining the critical dimension of a semiconductor structure with a scanning electron microscope comprising the steps of:
    collecting a first measurement of a first semiconductor structure from a scanning electron microscope;
    collecting a second measurement of said first semiconductor structure from an atomic force microscope;
    establishing a relationship between said first measurement and said second measurement of said first semiconductor structure wherein said relationship indicates said second measurement if a third measurement from a scanning electron microscope of a second semiconductor structure has characteristics similar to said first semiconductor structure; and
    mapping a two dimensional waveform through a multi-dimensional decision space to a corresponding three dimensional characteristic using a parallel distributed process operationally connected to an output of said scanning electron microscope, said parallel distributed process containing coefficients that provide said multi-dimensional mapping space for the out put of said scanning electron microscope to map to an output value that provides information on the critical dimension of the semiconductor structure.

* * * * *